(12) United States Patent
Seo et al.

(10) Patent No.: US 11,460,952 B2
(45) Date of Patent: Oct. 4, 2022

(54) APPARATUS AND METHOD FOR AUTOMATICALLY CALIBRATING CAPACITANCE PER CHANNEL

(71) Applicant: ABOV SEMICONDUCTOR CO., LTD., Chungcheongbuk-do (KR)

(72) Inventors: Young Jin Seo, Seoul (KR); Young Gun Heo, Gyeonggi-do (KR)

(73) Assignee: ABOV SEMICONDUCTOR CO., LTD., Chungcheongbuk-Do (KR)

( * ) Notice: Subject to any disclaimer, the term of this patent is extended or adjusted under 35 U.S.C. 154(b) by 317 days.

(21) Appl. No.: 16/840,833

(22) Filed: Apr. 6, 2020

(65) Prior Publication Data
US 2020/0371144 A1 Nov. 26, 2020

(30) Foreign Application Priority Data
May 22, 2019 (KR) .......................... 10-2019-0059827

(51) Int. Cl.
*G06F 3/041* (2006.01)
*G06F 3/044* (2006.01)
*G01R 27/26* (2006.01)

(52) U.S. Cl.
CPC ....... *G06F 3/0418* (2013.01); *G01R 27/2605* (2013.01); *G06F 3/044* (2013.01); *G06F 3/0447* (2019.05)

(58) Field of Classification Search
CPC ...... G06F 3/044; G06F 3/0418; G06F 3/0447; G01R 27/2605; H03K 17/962
See application file for complete search history.

(56) References Cited

U.S. PATENT DOCUMENTS

| 9,019,220 | B1 | 4/2015 | Klein et al. |
| 10,719,182 | B2 * | 7/2020 | Tanuma ................. G06F 3/044 |

(Continued)

FOREIGN PATENT DOCUMENTS

| KR | 10-0974637 | 8/2010 |
| KR | 10-2011-0091380 | 8/2011 |

(Continued)

OTHER PUBLICATIONS

Korean Office Action dated Aug. 19, 2020 issued in Application No. 10-2019-0059827.

(Continued)

*Primary Examiner* — Amy He
(74) *Attorney, Agent, or Firm* — KED & Associates, LLP (57) ABSTRACT

Disclosed herein are an apparatus and method for automatically calibrating capacitance per channel, for measuring parasitic capacitance values of respective channels due to a difference in a length of a wiring of each capacitance sensing channel when a circuit is designed and adding a unique calibration capacitance value of each channel such that all channels have the same reference capacitance value that is preset, and in detail, the apparatus for automatically calibrating a capacitance per channel includes a touch sensing device including a plurality of touch sensing regions, and a capacitance measurement and calibration device configured to measure parasitic capacitances of channels connected to the plurality of touch sensing regions, respectively, and to add a unique calibration capacitance of each channel to a corresponding channel to acquire a preset reference capacitance when each channel is connected to the parasitic capacitance.

1 Claim, 9 Drawing Sheets

(56) References Cited

U.S. PATENT DOCUMENTS

2009/0153152 A1  6/2009  Maharyta et al.
2018/0173366 A1  6/2018  Zhang et al.

FOREIGN PATENT DOCUMENTS

KR  10-2014-0141111   12/2014
WO  WO 2018/157595    9/2018

OTHER PUBLICATIONS

European Search Report dated Sep. 30, 2020 issued in Application No. 20168761.3.

* cited by examiner

FIG. 9

APPARATUS AND METHOD FOR AUTOMATICALLY CALIBRATING CAPACITANCE PER CHANNEL

This application claims the benefit of Korean Patent Application No. 10-2019-0059827, filed on May 22, 2019, which is hereby incorporated by reference as if fully set forth herein.

BACKGROUND OF THE INVENTION

Field of the Invention

The present disclosure relates to an apparatus and method for automatically calibrating capacitance per channel, and more particularly, to an apparatus and method for automatically calibrating capacitance per channel, for measuring parasitic capacitance values of respective channels due to a difference in a length of a wiring of each capacitance sensing channel when a circuit is designed and adding a unique calibration capacitance value of each channel such that all channels have the same reference capacitance value that is preset.

Discussion of the Related Art

Recently, various types of electronic devices have been developed and manufactured using a capacitance touch sensor integrated circuit (IC). Thus, a sensitivity measurement operation, and tuning and threshold (THD) level operations need to be performed for each sensing channel whenever the touch sensor IC is mounted and developed, and accordingly, there is a problem in that a development time is lengthened and a development method is inconvenient.

Figure 1:
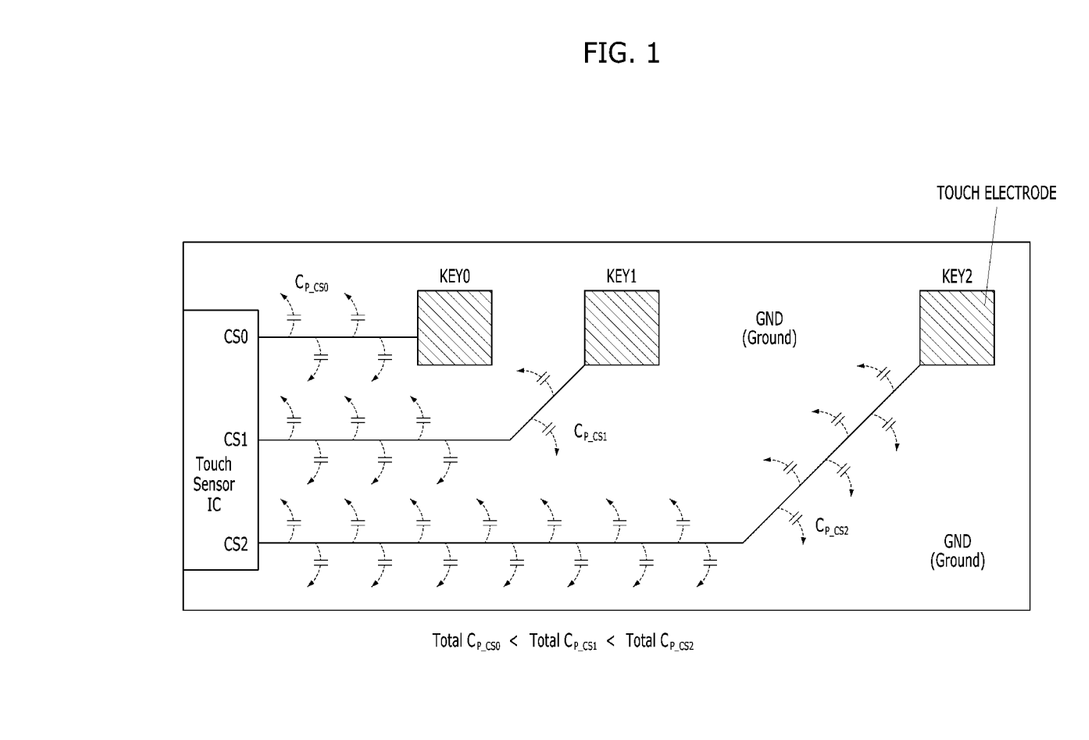
FIG. 1 is a diagram for explaining formation of a parasitic capacitance depending on a length of a wiring for each capacitance sensing channel.

FIG. 1 is a diagram for explaining formation of a parasitic capacitance depending on a length of a wiring for each capacitance sensing channel.

Referring to FIG. 1, when a printed circuit board (PCB) is designed, channels are connected through wirings (trace or route) according to arrangement of touch sensor integrated circuits (ICs) and touch electrodes. In this case, the length of a wiring connected to the touch electrode from the touch sensor IC is changed according to arrangement of touch electrodes. That is, as shown in the drawing, arrangement positions of capacitance sensing patterns KEY1 and KEY2 on the PCB are inevitably designed with different distances from a touch sensor IC chip. In this case, a capacitance value with a surrounding ground (GND) pattern is formed in an electric wiring (trace or route), which is referred to as a parasitic capacitance $C_p$. Parasitic capacitances formed in KEY1 to KEY3 based on the touch sensor IC are different, and a $C_p$ value $C_{P\_CS0}$ of KEY0 is lowest and a $C_p$ value $C_{P\_CS2}$ of KEY2 is highest. The touch electrodes may be a copper film pattern on the PCB and may also be assembled using a separate conductive device (metal gasket or spring pin).

As a result, an entire parasitic capacitance (C) value based on a channel pin having the shortest wiring length is lowest (CS0 and KEY0), and an entire parasitic capacitance value based on a channel pin having the longest wiring length is highest (CS2 and KEY2).

Figure 2A:
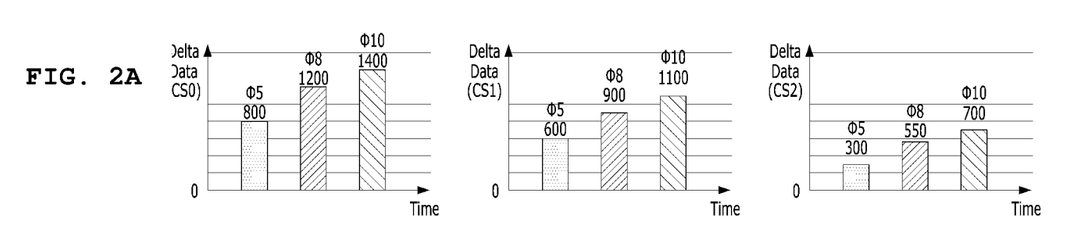
FIGS. 2A and 2B are diagrams for explaining a value of sensitivity of a conventional capacitance sensing touch sensor.
Figure 2B:
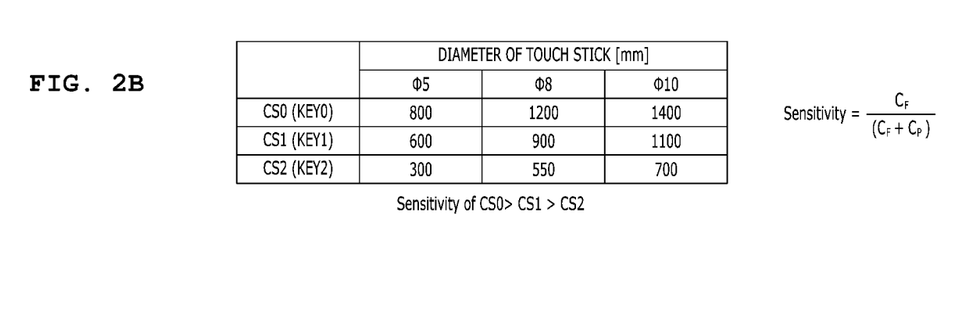

FIG. 2 is a diagram for explaining a value of sensitivity of a conventional capacitance sensing touch sensor.

First, FIGS. 2A and 2B show a digital change value (delta or difference data) related to sensitivity measured by a touch sensor IC. FIG. 2A is a graph showing a value that is measured using touch sticks with a diameter of 5 mm, 8 mm, and 10 mm, which are sequentially used, over time with respect to a corresponding channel, and it may be seen that the sensitivity of a channel CS0 (KEY0) with the lowest parasite C is measured to be higher than other channels. A ratio of sensitivity to a predetermined C value change (finger capacitance (CF)) may be changed depending on different parasitic capacitance (C) values for respective channels in a conventional touch sensor IC. In the case of a channel pin CS0 with the shortest wiring length like the measurement result of FIG. 2, the smallest parasite C value may be formed, the highest sensitivity value may be formed during touch. In contrast, in the case of a channel pin CS2 with the longest wiring length, the largest parasite C value may be formed, and the lowest sensitivity value may be formed during touch. This is because a ratio of variation of capacitance formed in an electrode CS0 by a touch stick to an originally formed parasite C value (total $C_{P\_CS0}$) is higher than other channels CS1 and CS2.

Figure 3:
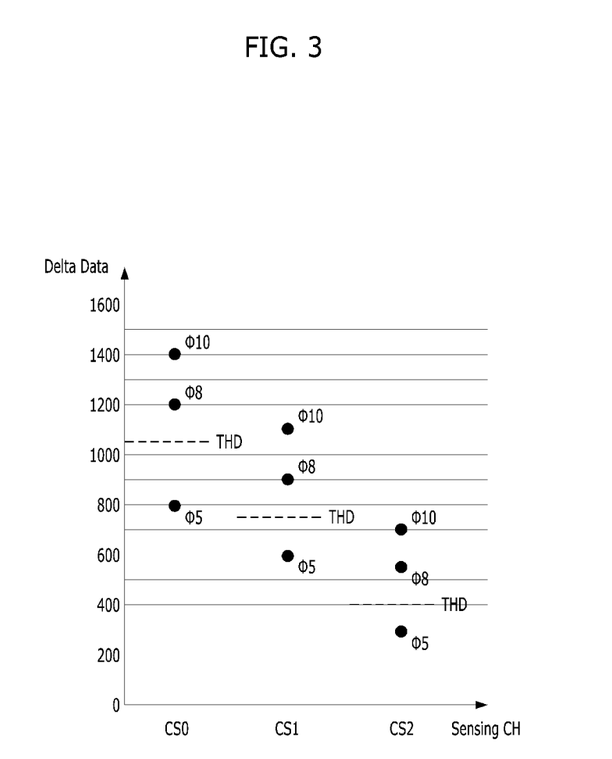
FIG. 3 is a diagram for explaining setting of a threshold (THD) level based on the sensitivity of a conventional capacitance sensing touch sensor.

FIG. 3 is a diagram for explaining setting of a threshold (THD) level based on the sensitivity of a conventional capacitance sensing touch sensor.

It is seen above that a ratio of sensitivity to a predetermined C value change (finger capacitance (CF)) during an external touch is entirely changed depending on a parasite C value that is different for each channel in a conventional touch sensor IC. For determination of press & release, a threshold level is required. In general, a target object needs not to be touched under a condition of a touch stick with a diameter of $5\pi$ and needs to be pressed under a condition of a touch stick with a diameter of $10\pi$. In general, a THD level may be formed at a diameter of about $7\pi$. In the graph of FIG. 3, a sensitivity value level of each channel is different, and thus, a THD level for each channel is differently set. This causes serious inconvenience because a sensitivity value needs to be checked and set for each channel during development related to sensitivity tuning.

CITED REFERENCE

Patent Document

Korean Patent No. 10-0974637

SUMMARY OF THE INVENTION

Accordingly, the present disclosure is directed to an apparatus and method for automatically calibrating capacitance per channel, for automatically calibrating a capacitance value of each channel to a preset reference capacitance value in order to simplify a sensitivity tuning development procedure due to a difference in a parasitic capacitance value due to a difference in a length of a wiring of each capacitance sensing channel when a circuit is designed.

The technical problems solved by the embodiments are not limited to the above technical problems and other technical problems which are not described herein will become apparent to those skilled in the art from the following description.

To achieve these objects and other advantages and in accordance with the purpose of the invention, as embodied and broadly described herein, an apparatus for automatically calibrating a capacitance per channel includes a touch sensing device including a plurality of touch sensing regions, and a capacitance measurement and calibration device configured to measure parasitic capacitances of channels connected to the plurality of touch sensing regions, respectively, and to add a unique calibration capacitance of each channel to a corresponding channel to acquire a preset reference capacitance when each channel is connected to the parasitic capacitance.

The capacitance measurement and calibration device may be connected in parallel to the parasitic capacitance.

The capacitance measurement and calibration device may include a calibration controller configured to measure a parasitic capacitance of each channel, to compare the measured parasitic capacitance of each channel with the reference capacitance, and to generate a calibration control signal for each channel corresponding to a comparison result, and a capacitance calibration circuit including a plurality of capacitance calibration modules configured to add calibration capacitances for respective corresponding channels to the respective channels in response to the calibration control signal for each channel.

In another aspect of the present disclosure, a method of automatically calibrating a capacitance per channel performed by the apparatus for automatically calibrating capacitance per channel includes measuring a parasitic capacitance per channel, for measuring the parasitic capacitance for each channel of the touch sensing device, detecting a maximum parasitic capacitance, for detecting a largest parasitic capacitance of the measured parasitic capacitances for respective channels, generating a calibration control signal, for comparing the maximum parasitic capacitance with the parasitic capacitance of each channel and generating a calibration control signal for each channel in response to a difference in capacitance, and adding a calibration capacitance, for adding each calibration capacitance to a corresponding channel in response to a corresponding control signal of the calibration control signal, wherein the measuring the parasitic capacitance per channel, the detecting the maximum parasitic capacitance, and the generating the calibration control signal are performed by the capacitance measurement and calibration device, and wherein the adding the calibration capacitance is performed by the plurality of capacitance calibration modules.

In another aspect of the present disclosure, a method performed by the apparatus for automatically calibrating capacitance per channel includes measuring a parasitic capacitance per channel, for measuring the parasitic capacitance for each channel of the touch sensing device, detecting a maximum parasitic capacitance, for detecting a largest parasitic capacitance of the measured parasitic capacitances for respective channels, generating a calibration control signal, for comparing the maximum parasitic capacitance with the parasitic capacitance of each channel and generating a calibration control signal for each channel in response to a difference in capacitance, and adding a calibration capacitance, for adding each calibration capacitance to a corresponding channel in response to a corresponding control signal of the calibration control signal, wherein the measuring the parasitic capacitance per channel, the detecting the maximum parasitic capacitance, and the generating the calibration control signal are performed by the capacitance measurement and calibration device, and wherein the adding the calibration capacitance is performed by the plurality of capacitance calibration modules.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, at least one embodiment of the present disclosure will be described in detail with reference to the accompanying drawings. In the following description, like reference numerals designate like elements although the elements are shown in different drawings. Further, in the following description of the at least one embodiment, a detailed description of known functions and configurations incorporated herein will be omitted for the purpose of clarity and for brevity.

It will be understood that, although the terms first, second, A, B, (a), (b), etc. may be used herein to describe various elements of the present disclosure, these terms are only used to distinguish one element from another element and essential, order, or sequence of corresponding elements are not limited by these terms. It will be understood that when one element is referred to as being "connected to", "coupled to", or "access" another element, one element may be "connected to", "coupled to", or "access" another element via a further element although one element may be directly connected to or directly access another element.

Figure 4:
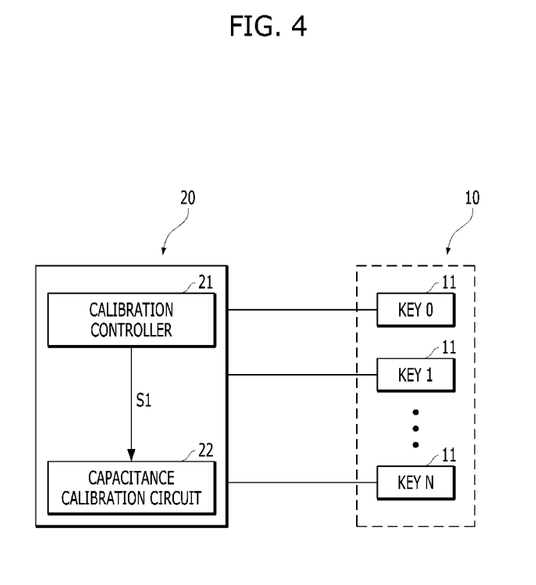
FIG. 4 is a diagram showing a concept of an apparatus for automatically calibrating a capacitance per channel according to an embodiment of the present disclosure.
Figure 5:
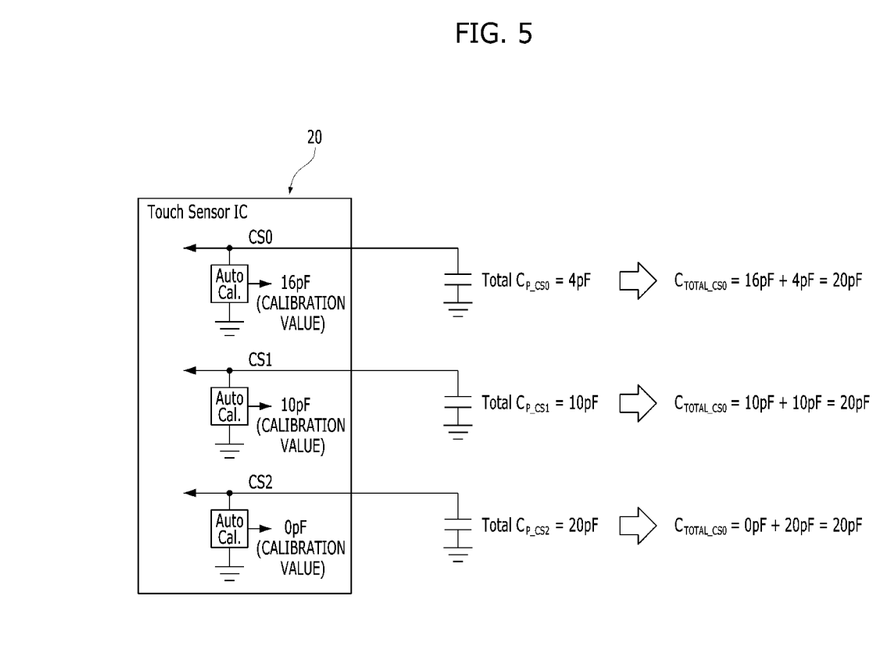
FIG. 5 is a diagram showing a concept of auto-calibration of a channel capacitance C according to an embodiment of the present disclosure.

FIG. 4 is a diagram showing a concept of an apparatus for automatically calibrating a capacitance per channel according to an embodiment of the present disclosure. FIG. 5 is a diagram showing a concept of auto-calibration of a channel capacitance C according to an embodiment of the present disclosure.

With reference to FIGS. 4 and 5, the apparatus for automatically calibrating a capacitance per channel according to the present disclosure will be described below.

First, referring to FIG. 4, the apparatus for automatically calibrating a capacitance per channel according to the present disclosure may include a touch sensing device 10 and a capacitance measurement and calibration device 20, in which case basic connection and configuration states may be understood with reference to FIG. 1 together.

The touch sensing device 10 may include a plurality of touch sensing regions. That is, the touch sensing device 10 may include a plurality of touch electrodes 11, i.e., (N+1) touch electrodes 11 to 'KEY N' from 'KEY 0'. The touch electrodes 11 may be formed as a copper film pattern on a printed circuit board (PCB) and may also be assembled using a separate conductive device such as a metal gasket or a spring pin. Positions of the touch electrodes 11 that correspond to a capacitance sensing pattern may has the same distance or different distances from the capacitance measurement and calibration device 20. Thus, referring to FIG. 1, parasitic capacitances $C_{p\_CS0}$, $C_{p\_CS1}$, and $C_{p\_CS2}$ may be inevitably different depending on the length of a wiring, and it may be seen that a parasitic capacitance of the touch electrode 11 that is farthest from the capacitance measurement and calibration device 20 is highest.

The capacitance measurement and calibration device 20 may measure parasitic capacitances of channels that are connected to the plurality of touch electrodes 11, respectively, and may add a unique calibration capacitance of each channel to a corresponding channel and may equalize the capacitances of the channels to acquire a preset reference capacitance when each channel is connected to the parasitic capacitance. The reference capacitance may be a maximum value, a minimum value, or a preset different value.

In more detail, the capacitance measurement and calibration device 20 may include a calibration controller 21 and a capacitance calibration circuit 22.

The calibration controller 21 may be connected to each of the touch electrodes 11 and may measure a parasitic capacitance of each connected channel. The calibration controller 21 may compare the reference capacitance with the measured parasitic capacitance of each channel. After comparison, a calibration control signal S1 for each channel corresponding to the comparison result may be generated. The calibration control signal S1 may be, for example, a control command for automatically calibrating capacitance values of different channels based on a channel reference value formed with the largest value to acquire the same value.

The capacitance calibration circuit 22 may include a plurality of capacitance calibration modules for adding calibration capacitances for respective corresponding channels to the respective channels in response to the calibration control signal S1 for each channel.

Referring to FIG. 5 together, a touch sensor IC that is the capacitance measurement and calibration device 20 may read all capacitance (C) values formed in respective channels and may calibrate internal capacitance values for the respective channels. That is, calibration capacitances for respective channels may be added to respective channels through the capacitance calibration circuit 22 according to the calibration control signal S1, and in this regard, based on a channel capacitance reference value formed with the largest value, capacitance values of other channels may be automatically calibrated. For example, all capacitance values may be equalized to 20 pF by calibrating CS0 to add 16p F and calibrating CS1 to add 10 pF based on 20 pF that is an entire capacitance value of CS2.

The capacitance measurement and calibration device 20 may be connected in parallel to the parasitic capacitance. That is, the capacitance calibration module may be configured as a circuit including a plurality of capacitors that are each connected in parallel to the parasitic capacitance. For example, referring to FIG. 5, parasitic capacitances '$C_{p\_CS0}$', '$C_{p\_CS1}$', and '$C_{p\_CS2}$' may each be connected in parallel to 20 capacitors, an on/off switch may be connected to each capacitor, and each capacitor may have a capacitance of 1 pF. The on/off switch may be operated according to the calibration control signal S1, and with regard to the capacitors that are connected in parallel to each other, capacitance values of the connected capacitors may be summed. Thus, in the case of 'CS0', a parasitic capacitance value of 4 pF and a calibration capacitance value of 16 pF may be summed to automatically calibrate 'CS0' to 20 pF while 16 on/off switches are connected. 'CS1' may be automatically calibrated to 20 pF while 10 on/off switches are connected, and 'CS2' may be maintained without connected switch. A capacitor that is connected in parallel to a parasitic capacitance may be configured to have a decimal point but not an integer, for example, 1.1, 1.2, 1.3, . . . to enable more precious calibration.

Figure 6A:
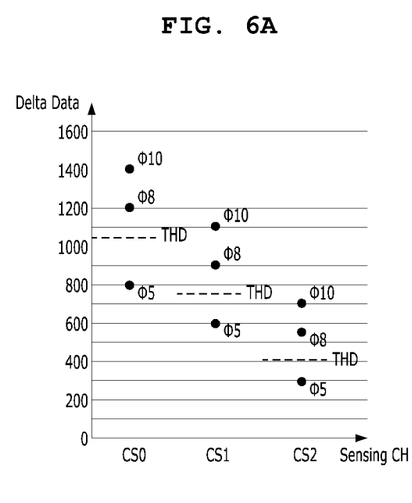
FIGS. 6A and 6B are diagrams for explaining setting of a threshold (THD) level according to the present disclosure.
Figure 6B:
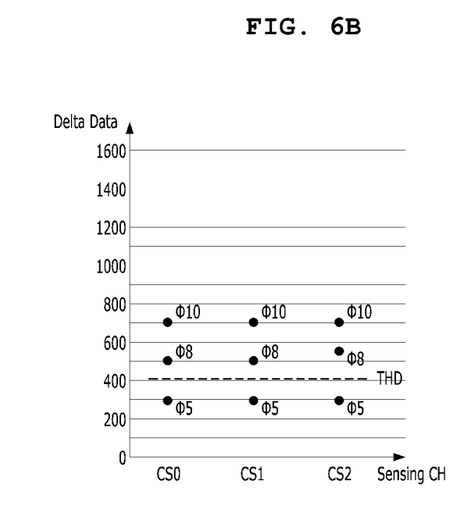

FIG. 6 is a diagram for explaining setting of a threshold (THD) level according to the present disclosure.

FIG. 6A shows sensitivity values for respective channels CS0, CS1, and CS2 using a touch stick with a diameter of 5π, 8π, and 10π and differently set THD levels for the respective channels in a conventional configuration illustrated in FIG. 1. This causes serious inconvenience because a sensitivity value needs to be checked and set for each channel during development related to sensitivity tuning.

In contrast, FIG. 6B shows sensitivity values and THD levels that are measured through auto-calibration related to a C value of a touch sensor IC according to the present disclosure, and the configuration of FIG. 1 is applied without changes. According to the present disclosure, the channels CS0, CS1, and CS2 may have the same capacitance value through a capacitance value automatic calibration function, and thus, THD Levels may be managed as one level, as shown in FIG. 6B. Thus, as well as a THD level setting operation, operations related thereto may also be easily performed.

Figure 7:
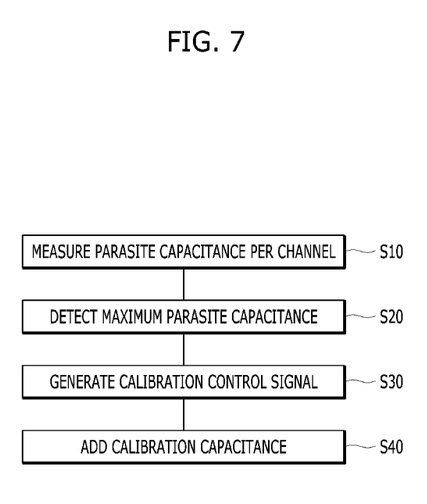
FIG. 7 is a diagram showing a configuration of a method of automatically calibrating a capacitance per channel according to an embodiment of the present disclosure.
Figure 8:
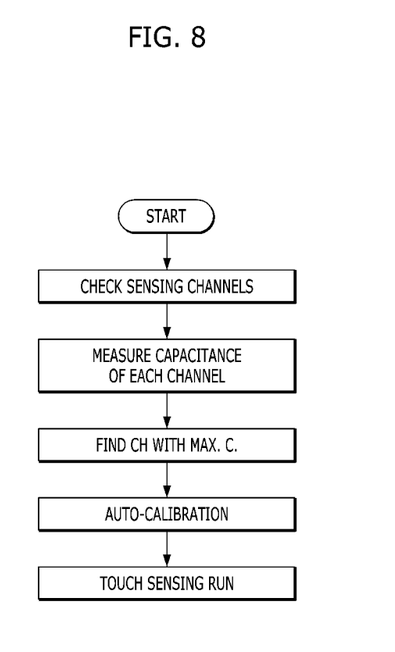
FIG. 8 is a diagram for explaining an algorithm of a method of automatically calibrating a capacitance according to an embodiment of the present disclosure.

FIG. 7 is a diagram showing a configuration of a method of automatically calibrating a capacitance per channel according to an embodiment of the present disclosure. FIG. 8 is a diagram for explaining an algorithm of a method of automatically calibrating a capacitance according to an embodiment of the present disclosure. Basic configurations and states are understood with reference to the description of FIGS. 1 and 4 to 6 together.

Referring to FIG. 7, the method of automatically calibrating a capacitance per channel according to the present disclosure may be performed using the aforementioned apparatus for automatically calibrating capacitance per channel and may include measuring a parasitic capacitance per channel (S10), detecting a maximum parasitic capacitance (S20), generating a calibration control signal (S30), and adding a calibration capacitance (S40).

In the measuring the parasitic capacitance per channel (S10), the capacitance measurement and calibration device 20 may measure a parasitic capacitance of each channel of the touch sensing device 10.

In the detecting the maximum parasitic capacitance (S20), the capacitance measurement and calibration device 20 may detect the largest parasitic capacitance of the measured parasitic capacitances for respective channels.

In the generating the calibration control signal (S30), the capacitance measurement and calibration device 20 may compare the maximum parasitic capacitance with the parasitic capacitance per channel and generate the calibration control signal S1 for each channel in response to a difference in the capacitance.

In the adding the calibration capacitance (S40), a plurality of calibration modules may add each calibration capacitance to a corresponding channel in response to a corresponding control signal of the calibration control signal S1, and the adding the calibration capacitance (S40) may be performed by the aforementioned plurality of capacitance calibration modules.

The algorithm of a method of automatically calibrating a capacitance per channel according to an embodiment is illustrated in FIG. 8, and referring to FIG. 8, a first touch sensing channel may be checked. Parasite parasitic capacitance values of respective sensed channels may be measured. A channel of the largest parasitic capacitance value among the measured parasitic capacitance values may be recognized. Then, like in the description of FIG. 5, capacitance values of all touch sensing channels may be adjusted to the largest parasitic capacitance value and then a THD level may be set based on the adjusted value and touch sensing may be performed as shown in FIG. 6B.

Figure 9:
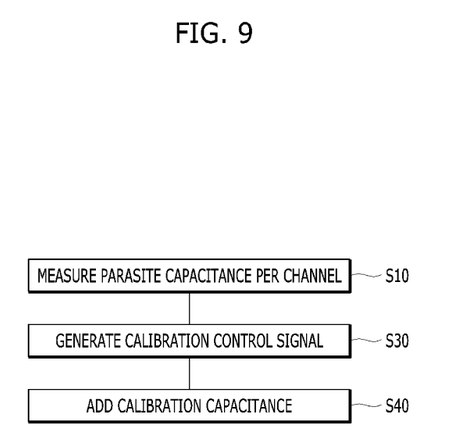
FIG. 9 is a diagram showing a configuration of a method of automatically calibrating a capacitance per channel according to another embodiment of the present disclosure.

The aforementioned algorithm correspond to a state in which a parasitic capacitance value according to an embodiment is adjusted to a maximum value, and in the case of actual development, a reference capacitance value may be differently set as necessary. FIG. 9 is a diagram showing a configuration of a method of automatically calibrating a capacitance per channel according to another embodiment of the present disclosure, and the present embodiment will be described with reference to the drawing.

That is, the method of automatically calibrating a capacitance per channel according to another embodiment of the present disclosure may be performed by the aforementioned apparatus for automatically calibrating capacitance per channel and may include measuring a parasitic capacitance per channel (S10), generating a calibration control signal (S30), and adding a calibration capacitance (S40).

In the measuring the parasitic capacitance per channel (S10), the capacitance measurement and calibration device 20 may measure a parasitic capacitance of each channel of the touch sensing device 10.

In generating the calibration control signal (S30), the capacitance measurement and calibration device 20 may compare the measured parasitic capacitance of each channel with a preset reference capacitance and may generate the calibration control signal S1 for each channel in response to a difference in the capacitance.

In the adding the calibration capacitance (S40), a plurality of calibration modules may add each calibration capacitance to a corresponding channel in response to a corresponding control signal of the calibration control signal S1, and the adding the calibration capacitance (S40) may be performed by the aforementioned plurality of capacitance calibration modules.

That is, according to another embodiment of the present disclosure, a preset reference capacitance value may be used instead of the largest parasitic capacitance value as a reference. The reference capacitance value may be a minimum value or may be another capacitance values that is set depending on an operation environment.

According to the aforementioned embodiments of the present disclosure, all channels may have the same capacitance value by automatically calibrating capacitance values for respective channels irrespective of a difference in parasitic capacitance values depending on a length of a wiring between channels, and thus, as well as a THD level setting operation, operations related thereto may also be easily performed.

The aforementioned apparatus and method for automatically calibrating capacitance per channel according to the present disclosure may have the following effects.

Parasite Parasitic capacitances of respective channels connected to a plurality of touch sensing regions may be measured, and a C value-related auto-calibration function of adding a unique calibration capacitance of each channel to a corresponding channel to acquire a preset reference capacitance when each channel is connected to the parasitic capacitance may be used, and thus, the same sensitivity value may be formed for the channels irrespective of touch sensors having wirings with different lengths and the same single THD level is set.

As such, a procedure of developing sensitivity tuning may be simplified, sensitivity tuning may be easily developed, and a development period thereof may be reduced.

Although all elements constituting the embodiments of the present disclosure are described as integrated into a single one or to be operated as a single one, the present disclosure is not necessarily limited to such embodiments. According to embodiments, all of the elements may be selectively integrated into one or more and be operated as one or more within the scope of the present disclosure. The term "comprises", "includes", or "has" described herein should be interpreted not to exclude other elements but to further include such other elements since the corresponding elements may be included unless mentioned otherwise. All terms including technical or scientific terms have the same meanings as generally understood by a person having ordinary skill in the art to which the present disclosure pertains unless mentioned otherwise. Generally used terms, such as terms defined in a dictionary, should be interpreted to coincide with meanings of the related art from the context. Unless differently defined in the present disclosure, such terms should not be interpreted in an ideal or excessively formal manner.

Although a few embodiments of the present disclosure have been shown and described, it would be appreciated by those skilled in the art that changes may be made in these exemplary embodiments without departing from the principles and spirit of the invention, the scope of which is defined in the claims and their equivalents. Accordingly, the above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A method of automatically calibrating a capacitance per channel performed by an apparatus for automatically calibrating capacitance per channel that comprises a touch sensing device including a plurality of touch sensing regions; and a capacitance measurement and calibration device configured to measure parasitic capacitances of channels connected to the plurality of touch sensing regions, respectively, and to add a unique calibration capacitance of each channel to a corresponding channel to acquire a preset reference capacitance when each channel is connected to the parasitic capacitance, the method comprising:

measuring the parasitic capacitance per channel, for measuring the parasitic capacitance for each channel of the touch sensing device;
  detecting a maximum parasitic capacitance, for detecting a largest parasitic capacitance of the measured parasitic capacitances for the respective channels;

generating a calibration control signal, for comparing the maximum parasitic capacitance with the parasitic capacitance of each of the channels and generating the calibration control signal for each channel in response to a difference in capacitance; and adding the calibration capacitance, for adding each calibration capacitance to a corresponding channel in response to the corresponding control signal of the calibration control signal, wherein the measuring the parasitic capacitance per channel, the detecting the maximum parasitic capacitance, and the generating the calibration control signal are performed by the capacitance measurement and calibration device; and wherein the adding the calibration capacitance is performed by a plurality of capacitance calibration modules.

* * * * *